United States Patent [19]
Berdan et al.

[11] 3,898,095
[45] Aug. 5, 1975

[54] METHOD OF ETCHING ALUMINUM

[75] Inventors: Betty L. Berdan, Willowick; William M. King, Mentor, both of Ohio

[73] Assignee: Gould Inc., Chicago, Ill.

[22] Filed: Jan. 7, 1974

[21] Appl. No.: 431,059

[52] U.S. Cl. .......... 134/3; 156/23; 134/27; 134/41
[51] Int. Cl. ........ C23f 3/02; C23g 1/12; C23g 1/22
[58] Field of Search .......... 156/21, 22, 23, 7; 134/3, 134/26, 27, 28, 29, 41

[56] References Cited

UNITED STATES PATENTS

| | | | |
|---|---|---|---|
| 2,396,685 | 3/1946 | Coggins | 156/23 |
| 3,600,245 | 8/1971 | Gates | 156/22 |
| 3,761,368 | 9/1973 | Ford et al. | 156/7 |

*Primary Examiner*—Charles E. Van Horn
*Assistant Examiner*—Jerome Massie
*Attorney, Agent, or Firm*—Edward E. Sachs

[57] ABSTRACT

A method of uniformly etching a surface of aluminum foil, by immersing the foil in a bath of alkaline etchant, leveling a film of alkaline etchant carried by the foil as it is withdrawn from the bath, cooling the foil to retard the etching reaction, and flooding the surface to be uniformly etched with water to remove the leveled etchant film. The etched aluminum foil may then be treated with an aqueous acid solution to desmut the foil and neutralize residual etchant.

8 Claims, 1 Drawing Figure

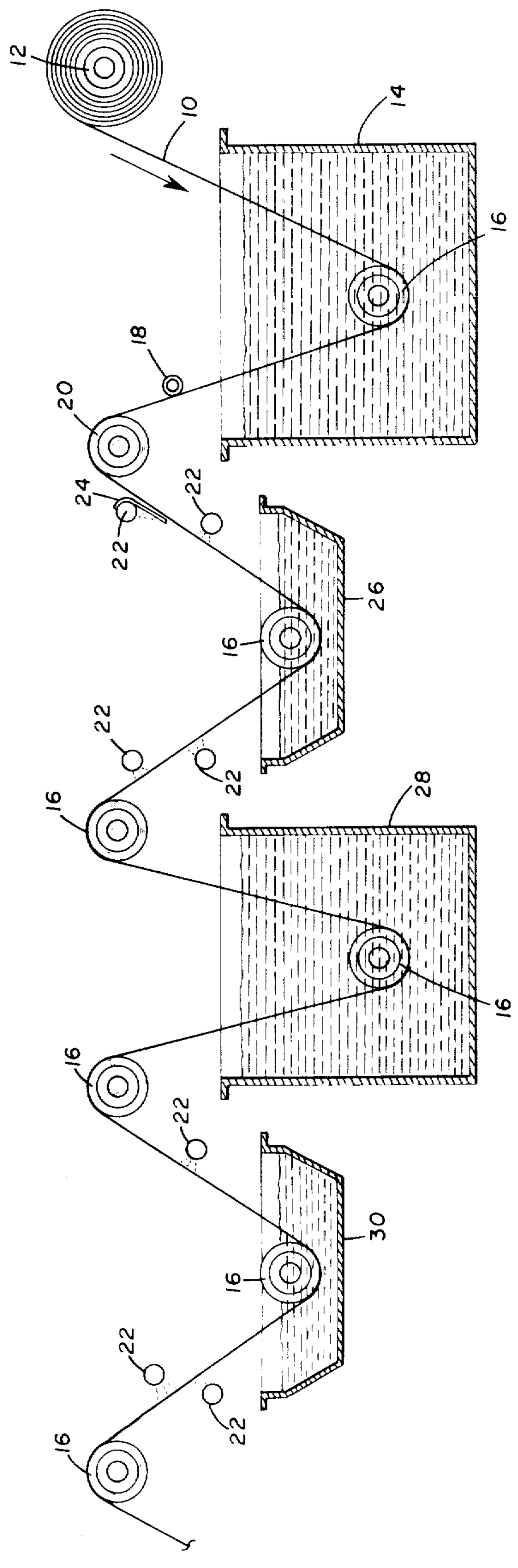
12
10
14
16
18
20
24
22
22
26
16
22
22
16
28
16
16
22
30
16
22
22
16

METHOD OF ETCHING ALUMINUM

The present invention relates to the metal etching art, and more particularly, to a method of continuously and uniformly etching a thin foil of aluminum. The etched surface produced in accordance with the method of the present invention provides an excellent substrate upon which may be deposited, electrolytically, ultra-thin films of copper, which in turn find utility in the manufacture of printed circuit boards.

BACKGROUND OF THE INVENTION

Japanese patent application Serial No. 87053/1972, filed Aug. 29, 1972, and laid open for inspection on May 24, 1973, under No. 35357/1973, describes a method of manufacturing an ultra-thin film of copper on the order of 17 microns in thickness, or even thinner. This is accomplished by electroplating the copper on a temporary backing material or carrier, such as aluminum foil, and then removing the carrier after the copper has been adhesively secured to a permanent substrate, for example, a printed circuit board formed of a glass fiber-reinforced expoxy resin.

Because of the extreme thinness of the copper films electrolytically deposited on the temporary carrier, it is quite important that the carrier be uniform in every sense. It should be uniform in thickness, in surface finish, and in its ability to accept a deposit of copper. The thinness of the copper film leaves exceedingly little room for compensating for irregularities in the temporary carrier. It has been found, in accordance with the present invention, that by taking certain special precautions, described fully hereinafter, one can insure that the surface of the temporary carrier is extremely uniform and quite capable of performing as a temporary support for the production of very satisfactory ultra-thin films of copper.

The conventional method for preparing aluminum foil for use as a temporary carrier for electrolytically deposited copper is to etch a given surface of the aluminum foil with an alkaline etchant. We have found that the conventional techniques of immersing the aluminum foil in an aqueous alkaline etchant bath, withdrawing the foil from the bath and rinsing the given surface of foil with water, will not produce an aluminum foil surface which is sufficiently uniform to produce consistently satisfactory ultra-thin films of copper. At best, the conventional techniques produce an etched surface which is streaked even to the naked eye, and at worst, they produce perforated aluminum foil.

SUMMARY OF THE INVENTION

It is therefore an object of the present invention to provide an improved method for uniformly etching a given surface of aluminum foil.

A further object of the invention is to provide a method of uniformly etching a given surface of aluminum foil as a continuous operation.

Still another object of the invention is to provide a continuous method for uniformly etching a given surface of aluminum foil such that the foil can be used successfully as a temporary carrier for the electrolytic deposition of ultra-thin films of copper.

In accordance with these and other objects of the present invention, there is provided a continuous method of uniformly etching a given surface of aluminum foil which involves the steps of immersing the foil in a bath of alkaline etchant for a time sufficient to etch the given surface; withdrawing the foil from the bath with a film of etchant adhering to the given surface; leveling the film of etchant; cooling the foil to retard the etching reaction; gently and uniformly flooding the given surface with water to remove the leveled etchant film; and water rinsing the foil to remove residual etchant.

In accordance with a further aspect of the invention, the etched foil treated above may be further processed by contacting it with an aqueous acid solution for a time sufficient to neutralize any residual alkalinity which may have been retained in the rinse water on the foil, and to desmut the surface of the foil; and thereafter water rinsing the foil.

In accordance with yet another aspect of the invention, the aluminum foil may be treated with a plurality of alkaline etching and acid neutralizing and desmutting cycles.

Other objects, features, aspects and advantages of the invention will become apparent from a reading of the following detailed description taken together with the accompanying drawing, which discloses certain preferred embodiments of the invention.

BRIEF DESCRIPTION OF THE DRAWING

The sole FIGURE of drawing is a highly schematic side elevation view showing the passage of foil from a roll through the various baths and processing steps of the invention.

DESCRIPTION OF THE PREFERRED EMBODIMENT

With reference to the single figure drawing, it will be seen that as aluminum foil 10 is unreeled from roll 12, it passes into tank 14 and around the guide roll 16. Tank 14 contains an alkaline etchant bath, and may be provided with temperature control means (conventional and, therefore, not illustrated) as may be required to maintain the temperature of the bath reasonably constant.

As foil 10 is withdrawn from tank 14, it carries with it an adherent film of etchant composition.

It should be noted at this point that the reaction of alkali on aluminum is exothermic. As long as the reaction takes place beneath the level of the bath in tank 14, the temperature of the foil will remain relatively constant since the liquid bath will transfer heat away from the foil rather rapidly.

However, as soon as the foil with its adherent film of etchant composition is exposed to air, which is a poorer conductor of heat than is the liquid bath, the temperature of the foil will increase. This increase in temperature will in turn increase the rate of attack of the etchant composition on the aluminum.

To control and counteract the increased rate of reaction in air, there is provided at the exit side of tank 14, just slightly above the normal liquid level of the tank, means for leveling the thickness of etchant film, which in the embodiment illustrated takes the form of metering rod 18. This device may be suspended in the path travel of foil 10, in which case simply rides against the film of etchant, leveling the thickness of the film as foil 10 passes under the metering rod. Alternatively, the metering rod may be fixedly mounted in suitably adjustable journals so that it may be moved into and out of the path travel of foil 10 for more accurate adjustment.

By leveling the film of etchant on the surface of foil 10, metering rod 18 tends to insure that the rate of reaction of the etchant on the aluminum will proceed essentially uniformly across the surface of the foil.

In order to retard the rate of etching reaction, foil 10 is then passed over guide roll 20 which is provided with cooling means (conventional and, therefore, not shown). The cooling of guide roll 20 may be accomplished by circulating therethrough in any conventionaal manner any of the well known coolants, such as brine, Freon, or the like. At a linear speed of 2 ft./min., it is generally found that circulating tap water provides adequate cooling.

The achievement of a uniformly etched surface also requires that the etching reaction be terminated essentially simultaneously across the width of foil 10. We accomplish this by gently and uniformly flooding the etched surface of the aluminum foil with water to remove the leveled etchant film. To this end, there is provided manifold pipe 22 mounted transversely of the path of travel of foil 10, provided with a series of uniformly spaced holes. Surrounding manifold pipe 22 is deflector 24 against which impinge the streams of water issuing from the holes in manifold pipe 22. The water leaves deflector 24 in a continuous sheet extending from edge to edge across foil 10. Were it not for the use of deflector 24, water issuing from manifold pipe 22 would impinge against the etchant film on foil 10 in discrete streams, which would then spread out and completely cover the surface of the foil. However, this would result in an etched surface having stripes, since the etched reaction would slow down or stop in the areas directly beneath the discrete streams of impinging water before they would slow down or cease in the areas to which the discrete streams of impinging water spread. It will therefore be understood that to obtain a uniformly etched surface, it is necessary that water contact the foil across its width substantially simultaneously.

Foil 10 then travels toward tank 26 which contains wash water, with the back side of the foil being washed free of etchant film by water issuing from manifold pipe 22. Since it is not necessary that the back side of the foil be provided with a uniformly etched surface, it is unnecessary to control the manner in which wash water impinges against the back side of the foil.

After passing under guide roll 16 in tank 26, foil 10 is then withdrawn from the tank and both sides are sprayed with water issuing from additional manifold pipes 22. At this point in the method, it is unnecessary to control the manner of impingement of water on the surface to be uniformly etched, since the etchant contained in the residual liquid remaining on the surface of the foil is so dilute as to be essentially incapable of accomplishing any further etching in the time it takes for the foil to be withdrawn from tank 26 until its etched surface is further rinsed.

At this point, it may be desirable to dry the etched film, particularly if it is to be stored rather than plated immediately. Or the etched foil may be passed directly to an electrolytic plating cell for plating with copper. However, in accordance with a preferred form of the invention, the uniformly etched foil is passed over another guide roll 16 and into tank 28 which contains an aqueous acid solution, the function of which is to neutralize whatever residual alkaline values may remain in the rinse water retained on the surface of the foil, and to desmut the foil by removal from the surface thereof any retained by-products of the etching process.

After entering tank 28, the foil passes under guide roll 16, exits from tank 28, passes over another guide roll 16 into tank 30 which contains rinsing water. Prior to entering tank 30, the back side of foil 10 may be sprayed with rinse water issuing from manifold pipe 22.

Within tank 30, foil 10 passes under guide rolls 16, and exits from the tank between manifold pipes 22 positioned on both sides of the foil, and from which rinse water issues to remove any residual acidic material contained in the retained liquid on the surfaces of the foil. Finally, the foil traverses the last illustrated guide roll 16 and thence may be directed to an electroplating bath.

The thickness of aluminum foil which may be used in the practice of the invention is limited only by the need for sufficient flexibility to conform to the guide rolls, and sufficient strength to withstand the stressed imposed by the guide rolls.

Where the aluminum foil is to be used as a temporary carrier for plating of ultra-thin films of copper, the aluminum foil will generally have a thickness with a range of about 1 to about 8 mils., and preferably within the range of about 1½ to 2 mils.

Aluminum and aluminum based alloys of widely varying compositions may be etched in accordance with the teachings of the present invention. However, where the aluminum foil is to be used as a temporary carrier for the electroplating of ultra-thin films of copper, it is generally preferred that the foil be formed of a composition containing at least about 99 wt. % aluminum. Commercially available aluminum alloys meeting this criterion are alloy 1100 and alloy 1145.

By way of example only and without intending to limit the scope of the invention, aluminum foil formed of alloy 1100 and measuring within the range of 1½ to 2 mils. thick has been successfully etched in accordance with the teachings of the present invention. The etching composition used contained from about 1.5 to 2.5 wt. % sodium hydroxide in admixture with sodium gluconate (a sequestering agent) and a suitable wetting agent, such as sodium lauryl sulfate.

With the etchant composition maintained at a temperature of about 22°C, satisfactory etching was achieved with a foil line speed of 2 ft./min., which provided 2 min. contact time with the etchant composition.

Water rinses consisted of ambient temperature tap water, and the cooling roll was cooled with tap water.

Where an aqueous acid solution was employed, this consisted of a solution of nitric acid containing from at least about 110 to 500 gm/l of nitric acid, and preferably from about 250 to 350 gm/l nitric acid. The acid solution was maintained at ambient temperatures and again the line speed of 2 ft./min. provided a 2 min. contact time with the acid solution.

Under some circumstances, it may be desirable to cyclically repeat the alkaline etch and acid neutralization steps; two or more cycles may be used. It will be understood that the contact time for each cycle will be less than that suggested above for a single cycle, though the reduction need not be in direct proportion to the number of cycles conducted.

While the invention has been described with reference to certain specific embodiments, neither the embodiments illustrated nor the terminology employed in describing them is intended to be limiting; rather, it is intended that the invention be limited only by the scope of the appended claims.

Having thus described our invention, we claim:

1. A continuous method of uniformly etching a given surface of aluminum foil comprising the steps of a. immersing said foil in a bath of alkaline etchant for a time sufficient to etch said given surface, b. withdrawing said foil from said bath with a film of etchant adhering to said given surface, c. leveling said film of etchant so that the rate of etching reaction proceeds essentially uniformly across the surface of the foil, d. cooling said foil at a rate sufficient to retard the etching reaction, e. uniformly flooding said given surface by flowing a continuous sheet of water extending substantially from edge to edge of said foil onto said given surface to remove said leveled etchant film, whereby the etching reaction is terminated essentially simultaneously across the width of the foil, and f. water rinsing said foil to remove residual etchant.

2. The method defined in claim 1 comprising the further steps of:

g. contacting said rinsed foil with an aqueous acid solution for a time sufficient to neutralize alkaline values in the rinse water retained on said foil and to dusmut at least the said given surface of said foil, and h. thereafter water rinsing said foil.

3. The method as defined in claim 1 wherein said foil is formed of a composition containing at least about 99 wt. % aluminum.

4. The method as defined in claim 3 wherein said foil has a thickness within the range of about 1 to about 8 mils.

5. The method as defined in claim 2 wherein said alkaline etchant comprises an aqueous solution of sodium hydroxide, a sequestering agent operative on solid by-products of the etch reaction, and a wetting agent.

6. The method defined in claim 5 wherein said aqueous acid solution comprises nitric acid.

7. The method as defined in claim 2 wherein steps (a) through (h) inclusive are repeated sequentially at least once.

8. The method defined in claim 1 wherein the said leveling of said film of etchant is accomplished with a metering rod.

* * * * *